(12) United States Patent
Kishimoto et al.

(10) Patent No.: US 10,724,598 B2
(45) Date of Patent: Jul. 28, 2020

(54) ACTIVE VIBRATION ISOLATOR

(71) Applicant: KURASHIKI KAKO CO., LTD., Kurashiki-shi, Okayama (JP)

(72) Inventors: Ichiro Kishimoto, Kurashiki (JP); Seigo Abe, Awara (JP); Rina Hoshida, Awara (JP); Min Li, Awara (JP); Shingo Takahashi, Kurashiki (JP)

(73) Assignee: KURASHIKI KAKO CO., LTD., Kurashiki-Shi (JP)

( * ) Notice: Subject to any disclaimer, the term of this patent is extended or adjusted under 35 U.S.C. 154(b) by 104 days.

(21) Appl. No.: 16/046,085

(22) Filed: Jul. 26, 2018

(65) Prior Publication Data
US 2019/0032747 A1 Jan. 31, 2019

(30) Foreign Application Priority Data

Jul. 27, 2017 (JP) ................. 2017-145761

(51) Int. Cl.
| | |
|---|---|
| *F16F 15/02* | (2006.01) |
| *G05B 19/404* | (2006.01) |
| *F16F 15/00* | (2006.01) |
| *F16F 15/027* | (2006.01) |
| *G05D 19/02* | (2006.01) |

(Continued)

(52) U.S. Cl.
CPC ............ *F16F 15/02* (2013.01); *F16F 15/002* (2013.01); *F16F 15/027* (2013.01); *G05B 19/404* (2013.01); *G05D 19/02* (2013.01); *F16F 15/0232* (2013.01); *F16F 2230/18* (2013.01); *G05B 2219/49048* (2013.01); *H01L 21/68* (2013.01)

(58) Field of Classification Search
None
See application file for complete search history.

(56) References Cited

U.S. PATENT DOCUMENTS 5,502,899 A * 4/1996 Yamaguchi ............. F16F 15/02
33/568
5,653,317 A 8/1997 Wakui
(Continued)

FOREIGN PATENT DOCUMENTS

| EP | 1124078 A2 | 8/2001 |
|---|---|---|
| EP | 1619407 A1 | 1/2006 |

(Continued)

*Primary Examiner* — Jason Lin
(74) *Attorney, Agent, or Firm* — Maschoff Brennan

(57) ABSTRACT

An active vibration isolator including a movable stage provides good vibration isolation performance. An active vibration isolator includes: a stage moving under thrust to position a mounted object; a vibration isolation table supporting the stage; a servo valve imparting, to the vibration isolation table, a control force that reduces vibrations of the vibration isolation table; a position/thrust obtaining unit obtaining a position of the stage on a movement track and the thrust actually applied to the stage with movement of the stage; and a vibration control FF control unit performing feed-forward control of the servo valve, based on what is obtained by the position/thrust obtaining unit, to allow the servo valve to generate a control force commensurate with vibrations of the vibration isolation table caused by the movement of the stage.

2 Claims, 6 Drawing Sheets

(51) Int. Cl.
*H01L 21/68* (2006.01)
*F16F 15/023* (2006.01)

(56) References Cited

U.S. PATENT DOCUMENTS

| | | | | |
|---|---|---|---|---|
| 2002/0080339 | A1* | 6/2002 | Takahashi | G03B 27/58 355/72 |
| 2006/0017908 | A1* | 1/2006 | Mayama | F16F 7/1005 355/72 |
| 2008/0114473 | A1 | 5/2008 | Heiland | |
| 2008/0309910 | A1* | 12/2008 | Takahashi | F16F 15/027 355/72 |
| 2010/0060220 | A1* | 3/2010 | Terada | F16F 15/02 318/460 |

FOREIGN PATENT DOCUMENTS

| | | |
|---|---|---|
| JP | 2008-115966 A | 5/2008 |
| JP | 4970904 B | 5/2008 |

\* cited by examiner

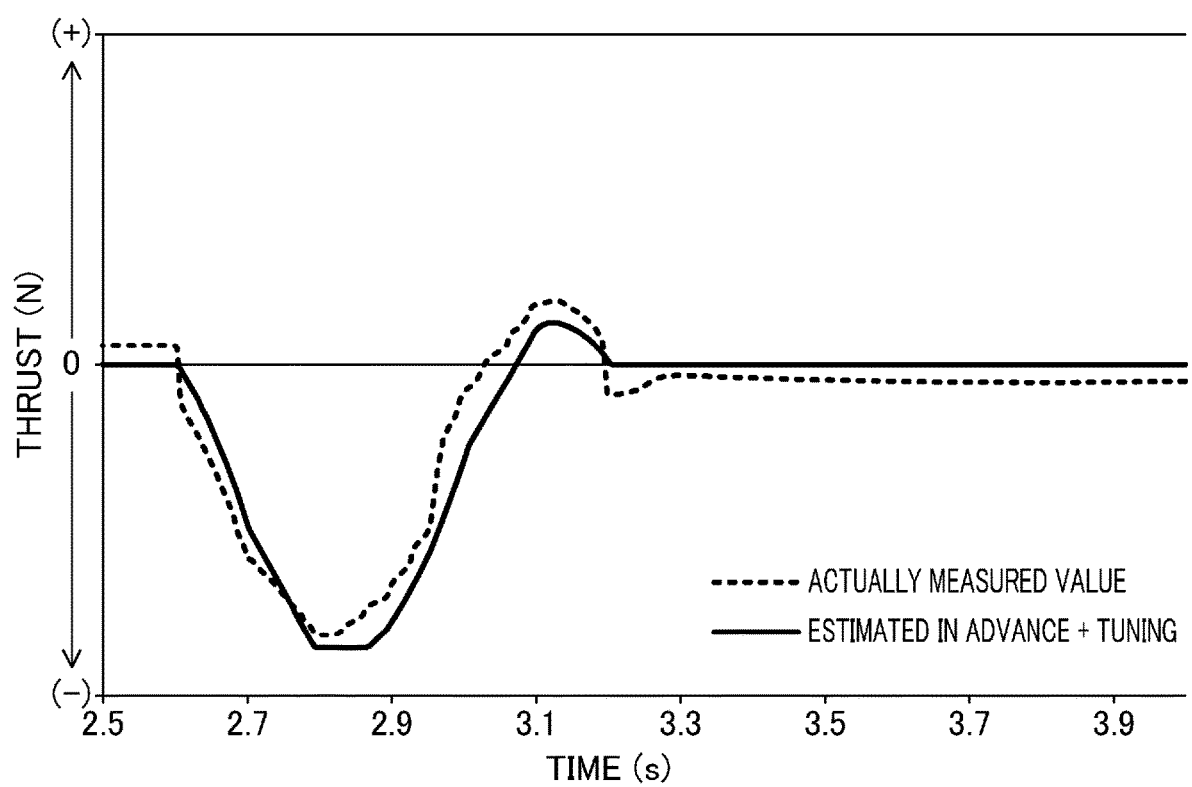

ACTIVE VIBRATION ISOLATOR

CROSS-REFERENCE TO RELATED APPLICATION

This application claims priority to Japanese Patent Application No. 2017-145761 filed on Jul. 27, 2017, the entire disclosure of which is incorporated by reference herein.

BACKGROUND

The present disclosure relates to an active vibration isolator.

Widely known manufacturing apparatuses for various types of precision instruments, such as semiconductors and liquid crystal panels, include a movable stage on which a target to be manufactured is mounted to achieve accurate and high-speed positioning (see, for example, Japanese Patent No. 4970904).

Generally, an object mounted on such a stage is a precision instrument that is being manufactured, and is therefore vibration-sensitive. To address this problem, Japanese Patent No. 4970904 described above discloses the use of an active vibration isolator to reduce the transmission of vibrations from a floor as much as possible.

Specifically, Japanese Patent No. 4970904 described above discloses an active vibration isolator. The active vibration isolator includes a movable stage, a vibration isolation table (a surface plate) that supports the stage, a servo valve that imparts, to the vibration isolation table, a control force that reduces vibrations of the vibration isolation table, and a vibration sensor (an acceleration sensor) provided on the vibration isolation table. The active vibration isolator is configured to perform feedback control of an actuator based on a signal from the vibration sensor.

Japanese Patent No. 4970904 described above further discloses that to reduce vibrations caused by the movement of the stage as well as the vibrations transmitted from the floor, not only the feedback control described above but also the feed-forward control is performed.

Here, some of the vibrations caused by the movement of the stage result from a reactive force applied to the vibration isolation table in response to a thrust imparted to the stage, and the other vibrations result from the torque associated with the reactive force. To reduce the vibrations resulting from the reactive force, an acceleration imparted to the stage, for example, needs to be obtained.

On the other hand, to reduce the vibrations resulting from the torque, control needs to be performed based on a combination of the position of the stage and the reactive force applied to the vibration isolation table through the movement of the stage. To achieve better vibration control performance, the vibrations resulting from the torque also need to be reduced.

To satisfy the needs, the active vibration isolator described in Japanese Patent No. 4970904 estimates, and computes, the position and acceleration of the stage (moving object), and performs feed-forward control reflecting the estimation results, thereby reducing the vibrations resulting from the reactive force applied to the vibration isolation table and the vibrations resulting from the torque.

SUMMARY

If the active vibration isolator according to Japanese Patent No. 4970904 described above is provided, information on control of the stage, for example, may be used to estimate the position and acceleration of the stage.

In this case, the position of the stage is typically subjected to feedback control, based on a signal fed from the position sensor. That is why a target value used for the feedback control may be used as the estimated value to provide a more accurate estimation of the position of the stage.

On the other hand, the acceleration of the stage is usually estimated without using the acceleration sensor, for the purpose of reducing manufacturing cost and other purposes. That is to say, this acceleration is not typically subjected to feedback control. Here, as an estimated value of the acceleration, the target value calculated based on information on the control of the stage, for example, may be used. However, in view of the friction applied to the stage and other similar forces, the estimated value may deviate from an actually measured value of the acceleration. Such a deviation is usually eliminated through feedback control. However, since the acceleration of the stage is not subjected to feedback control as described above, such a deviation remains.

Such a deviation between the estimated value of the acceleration and the actual acceleration may interfere with more precise control of the acceleration. Such a situation is not desirable for enhancing the vibration control performance of the active vibration isolator.

In view of the foregoing background, it is therefore an object of the present disclosure to provide an active vibration isolator including a movable stage and having good vibration control performance.

The present disclosure relates to an active vibration isolator. This active vibration isolator includes: a stage moving under thrust to position a mounted object; a vibration isolation table supporting the stage; an actuator imparting, to the vibration isolation table, a control force that reduces vibrations of the vibration isolation table; a stage condition obtaining unit obtaining a position of the stage on a movement track and the thrust actually applied to the stage with movement of the stage; and a controller controlling the actuator, based on what is obtained by the stage condition obtaining unit, to allow the actuator to generate a control force commensurate with vibrations of the vibration isolation table caused by the movement of the stage.

According to this configuration, when the stage including a precision instrument, such as a semiconductor, moves, the actuator is controlled based on the position of the stage on the movement track and the thrust actually applied to the stage through the movement of the stage, to reduce vibrations of the vibration isolation table caused by the movement of the stage. That is to say, the actual thrust applied to the stage is referred to instead of the acceleration of the stage. The actual thrust reflects, for example, friction applied to the stage. Thus, more precise control is achieved, and in turn, high vibration control performance is achieved.

In addition, control is performed based on a combination of the thrust actually applied to the stage and the position of the stage to reduce vibrations caused by the torque applied to the vibration isolation table. This also helps achieve high vibration control performance.

Thus, according to the configuration described above, control is performed based on a combination of the actual thrust applied to the stage and the position of the stage, thereby achieving high vibration control performance.

The active vibration isolator may further include: a second actuator imparting a thrust to the stage; and a second controller feeding a control signal to the second actuator to generate the thrust in response to the control signal. The stage condition obtaining unit may obtain the thrust applied to the stage in real time, based on the control signal output from the second controller.

To control the stage, a control system independent of the vibration isolation table may be used.

According to the configuration described above, one of the control signals for use to move the stage is diverted. This control signal corresponds to the thrust applied to the stage. This allows the stage condition obtaining unit to rapidly and reliably obtain the thrust applied to the stage without calculating the thrust from scratch.

The active vibration isolator may further include: the stage condition obtaining unit obtains the thrust applied to the stage in advance through calculation based on information on control of the stage.

According to this configuration, the thrust applied to the stage is calculated in advance, and the actuator is controlled based on the calculation result thus obtained. Such control allows the actuator to be controlled before control of the movement of the stage in a situation where a response lag is concerned, such as in a situation where the actuator is a pneumatic actuator. This allows a control force to be imparted to the vibration isolation table early enough before moving the stage generates shaking.

That is to say, the thrust and other factors are estimated based on the information on the control of the stage before the stage actually moves, thereby performing appropriate control. Even if a member having a long response lag, such as a pneumatic actuator, is used, a control force is imparted, without delay, to the vibration isolation table that is about to shake, thereby sufficiently reducing shaking.

The controller may control the actuator, based on what is obtained by the stage condition obtaining unit, to allow the actuator to generate a control force commensurate with vibrations caused by a torque applied to the vibration isolation table through the movement of the stage.

According to this configuration, shaking caused by the torque applied to the vibration isolation table through the movement of the stage can be sufficiently reduced.

As can be seen from the foregoing description, the active vibration isolator including a movable stage can provide good vibration control performance.

Figure 4:
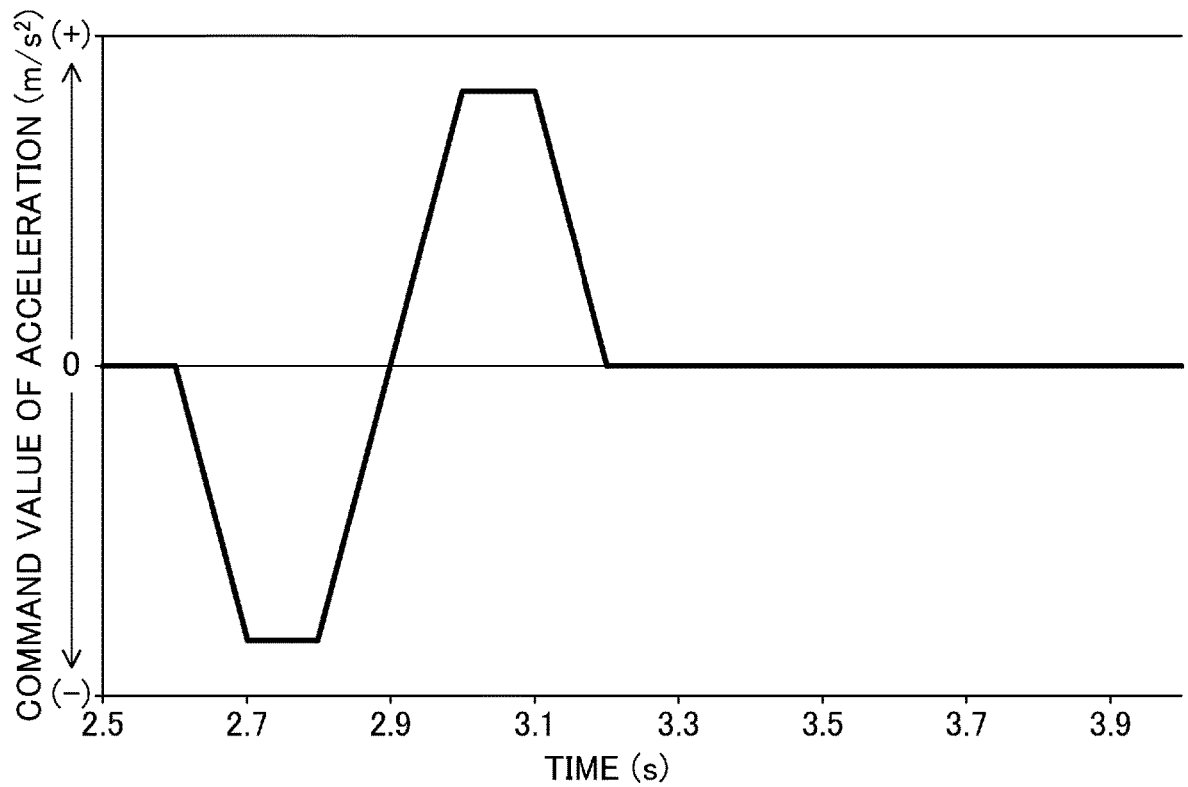
Figure 4:
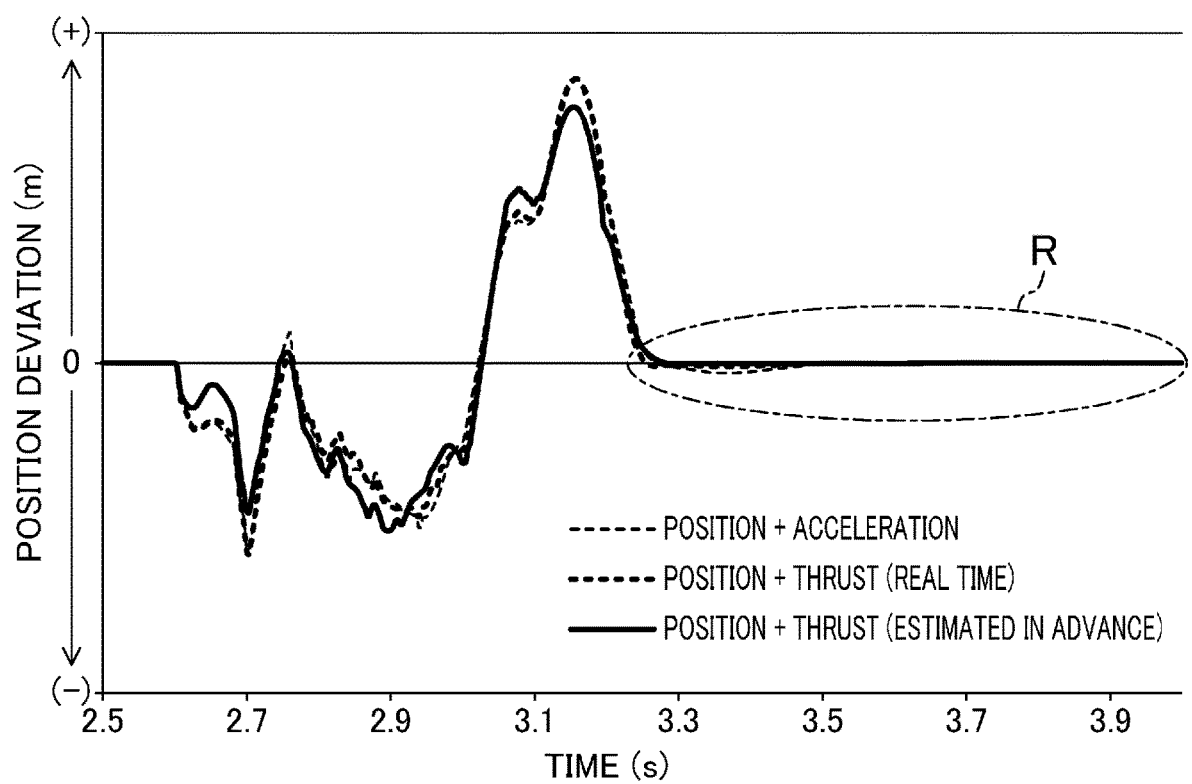

An upper portion of FIG. 4 is an explanatory graph showing a command value of acceleration of a stage, and a lower portion of FIG. 4 is an explanatory graph showing the difference (position deviation) between a target value and an actually measured value of the position of the stage. The difference is caused by the movement of the stage.

Figure 5:
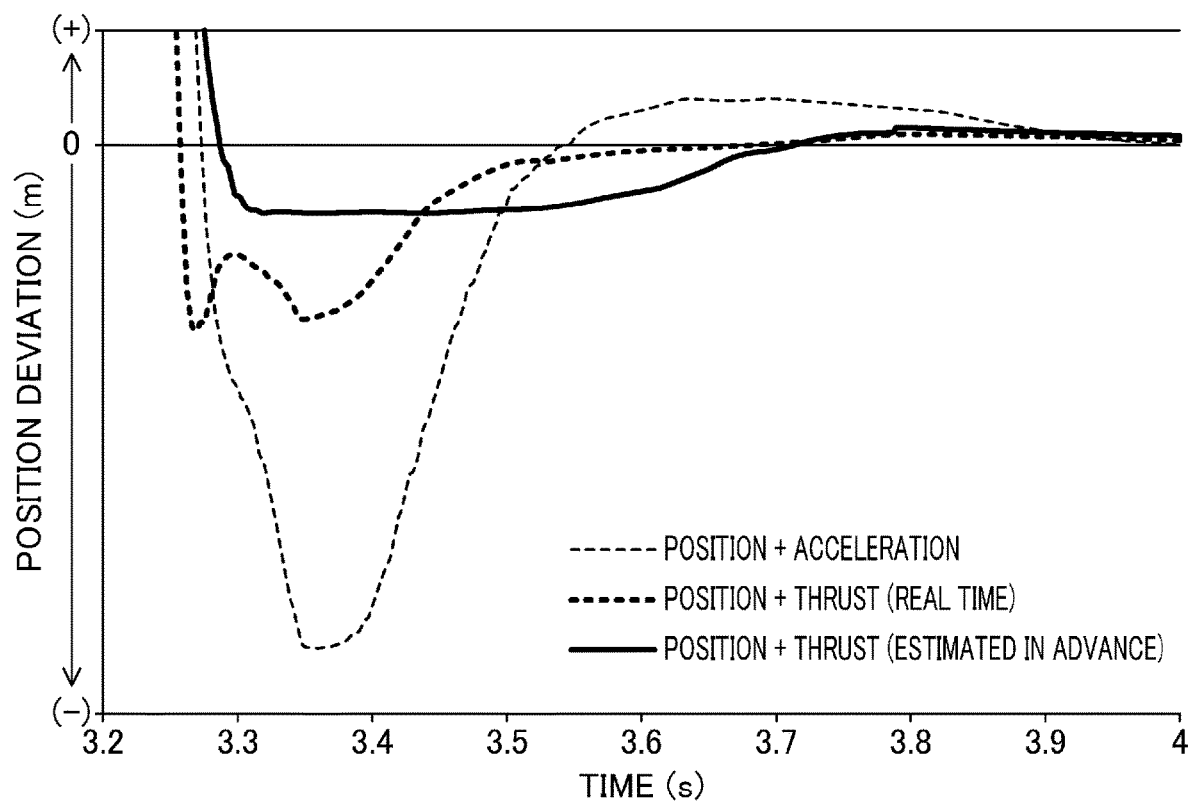

FIG. 5 is an explanatory graph showing, in an enlarged manner, an enclosed region shown in the lower portion of FIG. 4.

FIG. 6 is an explanatory graph exemplifying the relationship between the actual thrust applied to the stage and the value obtained by previously estimating, and tuning, the thrust.

DETAILED DESCRIPTION

Embodiments of the present disclosure will now be described with reference to the drawings. Note that the description below is an example.

First Embodiment

First, a first embodiment of the present disclosure will be described.

—Overall Configuration of Active Vibration Isolator—

Figure 1:
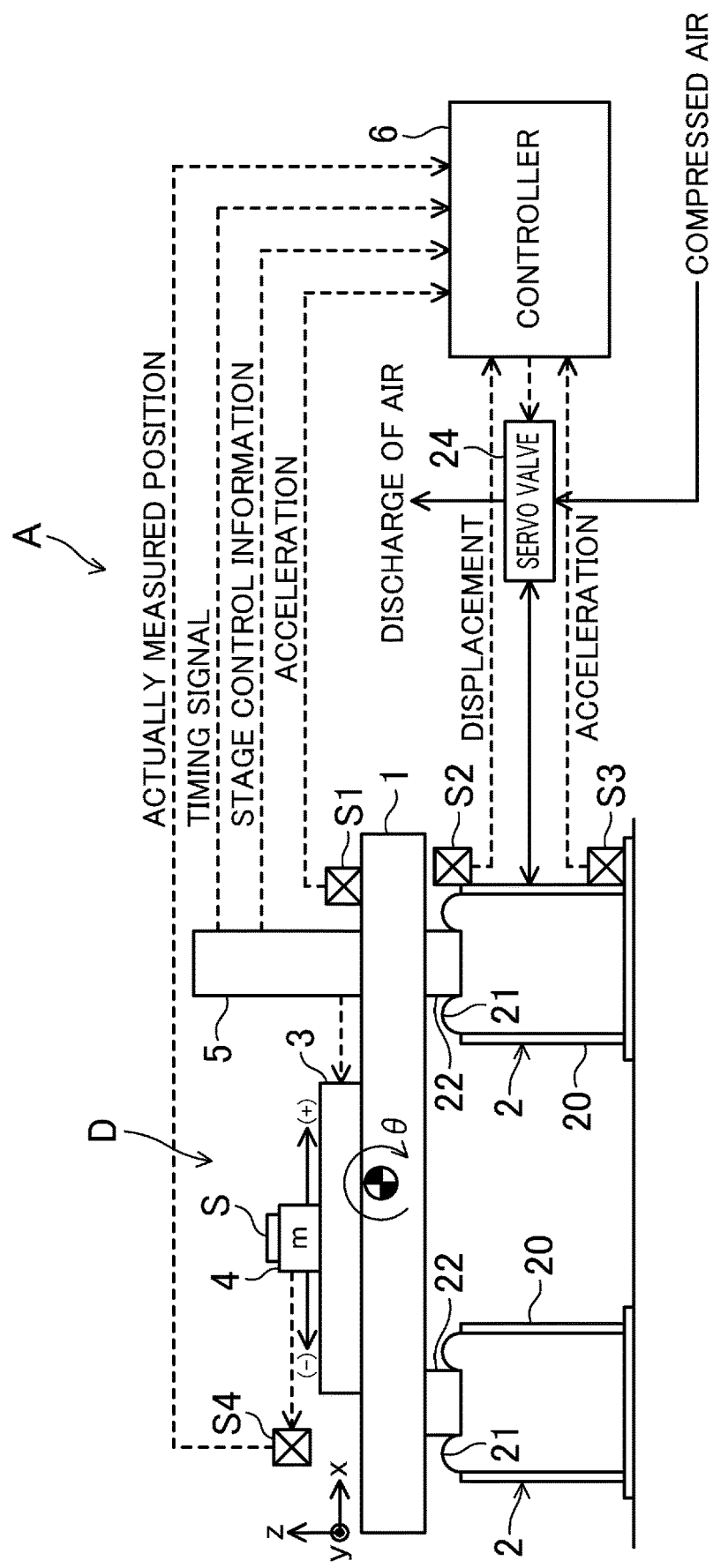
FIG. 1 illustrates a schematic configuration of an active vibration isolator.
Figure 2:
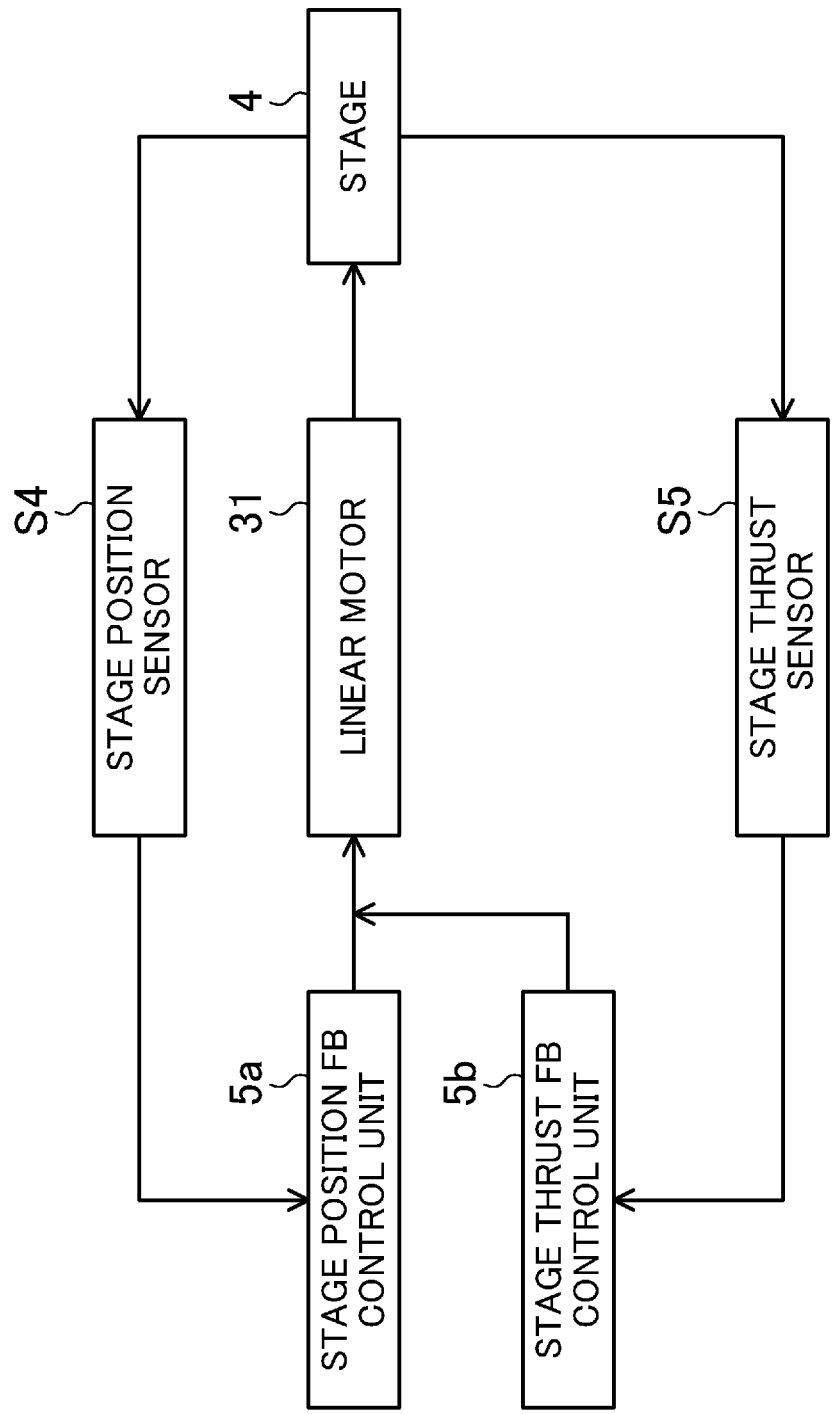
FIG. 2 is a block diagram showing how a stage is controlled.
Figure 3:
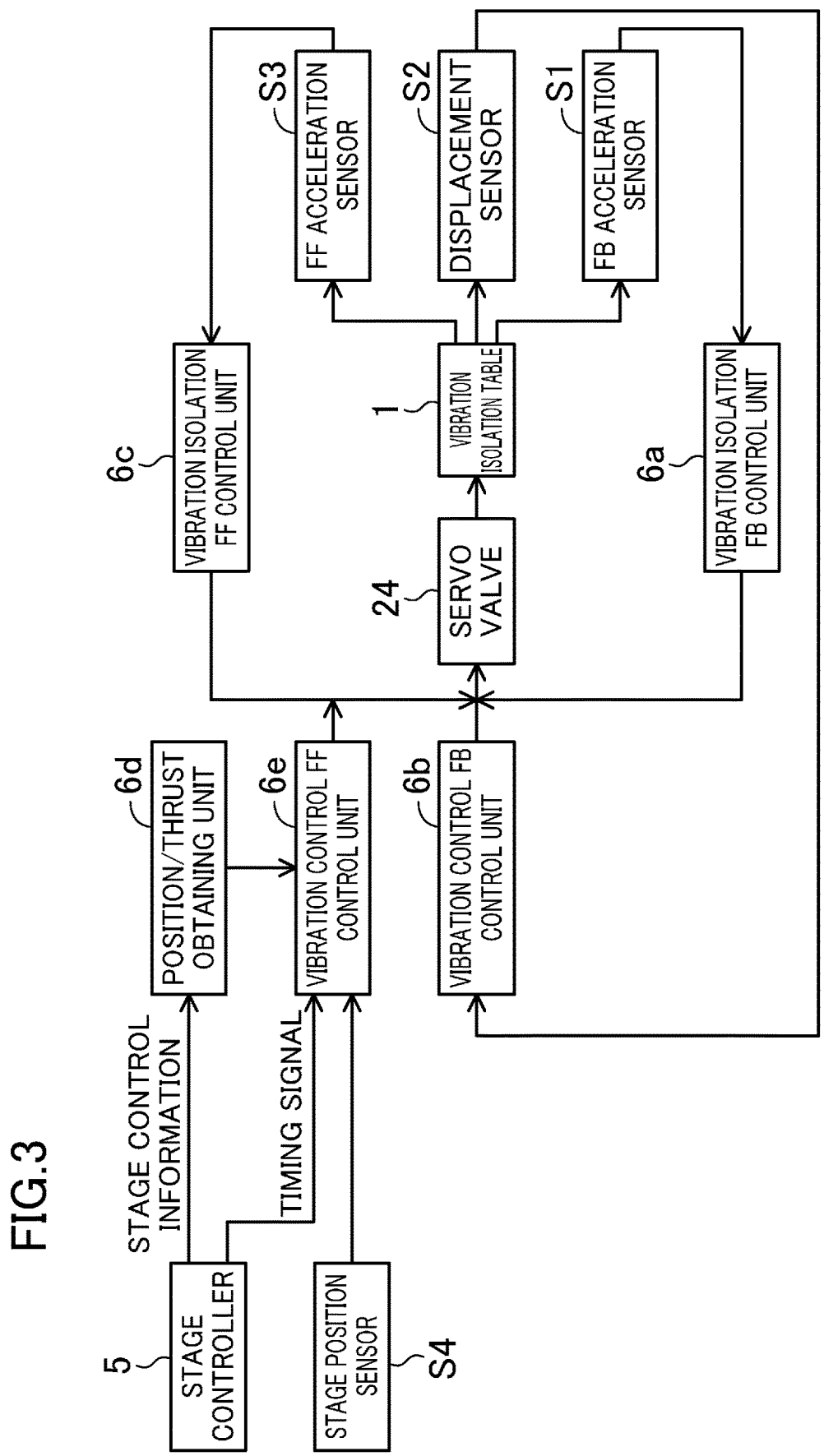
FIG. 3 is a block diagram showing how a vibration isolation table is controlled.

FIG. 1 illustrates a schematic configuration of an active vibration isolator A (hereinafter referred to as a "vibration isolator") according to the embodiment. FIG. 2 is a block diagram showing how a stage 4 of the vibration isolator A is controlled. FIG. 3 is a block diagram showing how a vibration isolation table 1 of the vibration isolator A is controlled.

The vibration isolator A includes a vibration isolation table 1 on which a precise apparatus D, which is susceptible to vibrations, such as a semiconductor-related manufacturing apparatus, is mounted. Here, the apparatus D is used to support any type of mounted object S, such as a silicon wafer, on the movable stage 4, and is designed to appropriately move the stage 4 to accurately position the mounted object S on the stage 4 at high speed.

Generally, the mounted object S on the stage 4 is a precision instrument that is being manufactured, and is therefore vibration-sensitive. For this reason, the vibration isolator A is configured as an active vibration isolator to reduce the transmission of vibrations from the floor as much as possible.

Specifically, the vibration isolator A according to the present embodiment includes the stage 4 moving under thrust to position the mounted object S, a vibration isolation table 1 supporting the stage 4, and a servo valve 24 imparting, to the vibration isolation table 1, a control force that reduces vibrations of the vibration isolation table 1.

Configurations of the components will now be described in detail.

The stage 4 is disposed on a body 3 of the apparatus D. In this exemplary configuration, the stage 4 is a supporting table that can move along a predetermined movement track (in this example, extending in a horizontal direction) through a ball screw mechanism. The above-described mounted object S is supported on the stage 4. The ball screw mechanism is merely an example of a mechanism for guiding the stage 4. For example, a so-called linear guide or aerostatic guide may be used.

In this exemplary configuration, the above-described ball screw mechanism includes a threaded rod (not shown) and a linear motor 31. The threaded rod is screwed into an internal threaded portion (not shown) of the stage 4, and extends horizontally through the stage 4. The linear motor 31 (shown only in FIG. 2) is drivably coupled to the threaded rod. The linear motor 31 rotating the threaded rod allows the stage 4 to move along the direction in which the threaded rod extends. In this embodiment, controlling the driving of the linear motor 31 allows horizontal thrust to be applied to the stage 4, thereby positioning the stage 4 in the apparatus D. The linear motor 31 is an example of a "second actuator." If a linear guide or an aerostatic guide is used instead of the ball screw mechanism, a direct-acting motor may be used instead of a rotary motor as the linear motor 31.

That is why a stage position sensor S4 and a stage thrust sensor S5 are provided in the vicinity of the stage 4. The stage position sensor S4 is used to detect the position of the stage 4 on the movement track (corresponding to the displacement of the stage 4 in the apparatus D). The stage thrust sensor S5 is used to detect the thrust actually applied to the stage 4. Output signals from these sensors S4 and S5 are fed to a stage controller 5. Note that the stage controller 5 is an example of a "second controller."

The vibration isolation table 1 is configured as a so-called surface plate, and is elastically supported from below by a plurality of air spring units 2, 2, . . . . The number of the air spring units is usually four, but merely needs to be three or more. The body 3 of the apparatus D is disposed on the vibration isolation table 1. This state is equivalent to a state where the vibration isolation table 1 supports the stage 4 with the body 3 interposed therebetween.

Specifically, the air spring units 2, 2, . . . are each configured as an air spring that supports a vertical load as shown in the drawing, and each include a case 20 and a piston 22. The case 20 is disposed on the floor surface or any other surface, and has an open upper end. The piston 22 is hermetically inserted in the open upper end of the case 20 via a diaphragm 21 to define an air chamber in the case 20. The vibration isolator A, which supports the load using air springs as described above, basically has good vibration isolation performance. In addition, in this embodiment, controlling the internal pressures of the air springs allows a control force that reduces vibrations to be imparted to the vibration isolation table 1.

That is why each air spring unit 2 is provided with an acceleration sensor S1 and a displacement sensor S2. The acceleration sensor S1 and the displacement sensor S2 are used to detect the acceleration and displacement of the vibration isolation table 1, respectively, in the vicinity of the location where the air spring unit 2 supports the load. The air spring unit 2 is further provided with another acceleration sensor S3 for detecting an acceleration of a lower portion of the case 20 (a floor vibration). Output signals from these sensors S1 to S3 are fed to the controller 6. In the example shown in the drawing, the output signals (an actually measured value of position, an actually measured value of thrust) from the stage position sensor S4 and the stage thrust sensor S5 are further fed to the controller 6.

Each air spring unit 2 is connected to a pipe for supplying compressed air from an air pressure source (not shown). The servo valve 24 provided in this pipe can regulate the flow rates of the compressed air supplied to and discharged from the air spring. The servo valve 24 is controlled by the controller 6, based on, for example, the signals fed from the sensors S1 to S4 as described above, thereby regulating the flow rates of the compressed air supplied and discharged. As a result, the internal pressure of the air spring is adjusted. Thus, vibrations of the vibration isolation table 1 and the apparatus D are reduced as will be described later. The servo valve 24 is an example of an "actuator."

FIG. 1 shows that only the right air spring unit 2 is provided with the vertical acceleration sensors S1, S3 and the displacement sensor S2, the pipe, the servo valve 24, and other components that all form its control system, but a similar control system is provided for each air spring unit 2.

Although not shown, similar air spring units 2, 2, . . . may be provided as actuators for generating a horizontal control force around the vibration isolation table 1. Alternatively, some of the air spring units 2, 2, . . . may be horizontal actuators. The air springs may have their internal pressures controlled to reduce horizontal vibrations of the apparatus D.

—Control of Stage—

Next, control of the stage 4 via the linear motor 31 will be specifically described. As shown in FIG. 2, what is input to the linear motor 31 mainly includes a feedback manipulated variable of position computed by a stage position FB control unit 5a based on a signal from the stage position sensor S4, and a feedback manipulated variable of thrust computed by a stage thrust FB control unit 5b based a signal from the stage thrust sensor S5.

The stage position FB control unit 5a operates linear motor 31 so that, based on a value detected by the stage position sensor S4, i.e., the actual position of the stage 4 on the movement track (an actually measured value of position), the detected value of position converges to a predetermined target value (hereinafter referred to also as the "command value of position"). For example, the actually measured value of position, its derivative value, and its integrated value are each multiplied by a feedback gain. The values thus obtained are summed, and then the resultant value is subtracted from the command value of position to obtain a value as a control input to the linear motor 31 (the feedback manipulated variable of position). This enables feedback control of the position of the stage 4.

The stage thrust FB control unit 5b operates the linear motor 31 so that, based on a value detected by the stage thrust sensor S5, i.e., the thrust actually applied to the moving stage 4 (an actually measured value of thrust), the actually measured value of thrust converges to a predetermined target value (hereinafter referred to also as the "command value of thrust"). For example, the actually measured value of thrust, its derivative value, and its integrated value are each multiplied by a feedback gain. The values thus obtained are summed, and then the resultant value is subtracted from the command value of thrust to obtain a value as a control input to the linear motor 31 (the feedback manipulated variable of thrust). This enables feedback control of the thrust applied to the stage 4.

Note that instead of using the stage thrust sensor S5, the stage thrust FB control unit 5b may be configured to detect a current fed to the linear motor 31, for example, and perform feedback control of the current. As can be seen, the thrust may be indirectly controlled via the physical quantity associated with the thrust (a physical quantity proportional to the magnitude of the thrust, such as the magnitude of the current) without using the stage thrust sensor S5.

In this exemplary configuration, the stage controller 5 feeds, to the linear motor 31, an electrical control signal determined in accordance with the feedback manipulated variables of position and thrust. The linear motor 31 adjusts the magnitude of the thrust to be applied to the stage 4 in accordance with the intensity of the control signal (i.e., the magnitude of the control signal regarded as the current). That is to say, as the intensity of the control signal increases, the torque applied to the above-described threaded rod by the linear motor 31 increases. Accordingly, the thrust applied to the stage 4 also increases. At this time, the actually measured value of thrust is detected by the stage thrust sensor S5, and is fed back to the stage controller 5.

Thus, if the thrust is fed back, the signal indicating the actual thrust, i.e., the actually measured value of thrust, reflects the influence of friction applied to the stage 4 and other elements.

The linear motor 31 rotates at the number of revolutions indicated by the control signal. The present state of the rotating linear motor 31, i.e., the actually measured value of position, is detected by the stage position sensor S4, and is fed back to the stage controller 5.

—Control of Vibration Isolation Table—

Next, control of the vibration isolation table 1 via the servo valve 24 will be specifically described. For the sake of convenience, only control of the air springs supporting a vertical load will be described. However, if air springs supporting a horizontal load are also provided, such air springs will be controlled in the same manner.

As shown in FIG. 3, what is input to the servo valve 24 mainly includes a feedback manipulated variable of vibration isolation computed by a vibration isolation FB control unit 6a based on a signal from the acceleration sensor S1, a feedback manipulated variable of vibration control computed by a vibration control FB control unit 6b based on a signal from the displacement sensor S2, and a feed-forward manipulated variable of vibration isolation computed by a vibration isolation FF control unit 6c based on a signal from the acceleration sensor S3.

The vibration isolation FB control unit 6a uses the air springs to generate a control force that reduces vibrations of the vibration isolation table 1, based on the value detected by the acceleration sensor S1 (i.e., the vertical acceleration of the vibration isolation table 1). For example, the detected acceleration, its derivative value, and its integrated value are each multiplied by a feedback gain. The values thus obtained are summed, and then the resultant value has its sign reversed to obtain a value as a control input to the servo valve 24 (the feedback manipulated variable of vibration isolation). This enables feedback control (vibration isolation feedback control) providing advantages similar to those provided by imparting rigidity to the vibration isolation table 1 or by increasing the mass of the vibration isolation table 1.

The vibration control FB control unit 6b controls the internal pressures of the air springs based on the value detected by the displacement sensor S2, i.e., a variation in the height of the vibration isolation table 1, so that the value detected decreases, thereby reducing the degree of inclination of the vibration isolation table 1 and the degree of shaking resulting from this inclination. For example, a displacement value detected is subtracted from a target value (zero), and then a control input to the servo valve 24 (the feedback manipulated variable of vibration control) is determined according to a PID control law. This enables feedback control (vibration control feedback control) of the height of the vibration isolation table 1.

Moreover, the vibration isolation FF control unit 6c is used to generate vibrations of phase opposite to that of vibrations transmitted from the floor to a target for vibration isolation, based on the value detected by the acceleration sensor S3, i.e., how the floor vibrates. The degree of the vibrations generated is high enough to cancel the vibrations transmitted. The control input to the servo valve 24 (the feed-forward manipulated variable of vibration isolation) can thus be determined using a digital filter, for example. The characteristics of the digital filter are expressed as $-H(s) \cdot K(s)^{-1}$, where $H(s)$ represents a transfer function obtained when floor vibrations are transferred through the air spring units 2 to the vibration isolation table 1, and $K(s)$ represents a transfer function of a compensation system comprised of the air spring units 2. This enables feed-forward control (vibration isolation feed-forward control) of floor vibrations.

The servo valve 24 operates in response to the control input described above, and the internal pressures of the air spring units 2 are controlled, thereby imparting an appropriate control force to the vibration isolation table 1 that is the target for vibration isolation. Specifically, the vibration isolation FF control unit 6c performs vibration isolation feed-forward control to reduce the transfer of vibrations transmitted from the floor, while micro-vibrations nevertheless transferred are reduced by the vibration isolation FB control unit 6a performing vibration isolation feedback control. This provides very high vibration isolation performance.

On the other hand, relatively large vibrations generated by operation of the apparatus D, i.e., vibrations (shaking) of the vibration isolation table 1 caused by the movement of the stage 4, are reduced not only by the vibration isolation feedback control described above but also by the vibration control FB control unit 6b performing vibration control feedback control. However, this advantage cannot help but be limited, because feedback control is performed after the vibration isolation table 1 is actually displaced or vibrated.

To address this problem, in this exemplary configuration, not only the vibration control feedback control described above but also the vibration control feed-forward control is performed to reduce vibrations caused by the movement of the stage 4 at an earlier timing.

Some of the vibrations caused by the movement of the stage 4 result from a reactive force applied to the vibration isolation table 1 in response to a thrust imparted to the stage 4, and the other vibrations result from the torque associated with the reactive force. That is why the position of the stage 4 alone, for example, is unsuitably used to reduce both types of vibrations at the same time.

To address this problem, the position and acceleration of the stage 4 are estimated and computed, and vibration control feed-forward control reflecting the estimation results is performed. This may reduce both of the vibrations resulting from the reactive force and the vibrations resulting from the torque at the same time.

Here, a target value (a command value) relating to control of the stage 4, for example, may be diverted to estimate the position and acceleration of the stage 4. A signal used in the stage position FB control unit 5a (a signal indicating a command value of position) may be diverted to estimate the position of the stage 4.

On the other hand, the acceleration of the stage 4 is usually estimated without using the acceleration sensor, for the purpose of reducing manufacturing cost and other purposes. That is to say, this acceleration is not typically subjected to feedback control. Here, as an estimated value of the acceleration, the target value calculated based on information on the control of the stage 4, for example, may be used. However, the estimated value may deviate from an actually measured value of the acceleration by the magnitude of the friction applied to the stage 4. Such a deviation is usually eliminated through feedback control. However, since the acceleration of the stage 4 is not subjected to feedback control as described above, such a deviation still remains.

Such a deviation between the estimated value of the acceleration and the actual acceleration may interfere with more precise control of the acceleration. Such a situation is not desirable for enhancing the vibration control performance of the vibration isolator A.

To address this problem, in this exemplary configuration, not the acceleration of the stage 4 but the actual thrust applied to the stage 4 is referred to, thereby computing the manipulated variable (vibration control FF manipulated variable) in combination with the actually measured position of the stage 4 and feeding the resultant control signal to the servo valve 24. This reference to the actual thrust applied to the state 4 constitutes a feature of the present disclosure.

Specifically, the controller 6 includes a position/thrust obtaining unit 6d (a stage condition obtaining unit), and a vibration control FF control unit 6e (a control unit) as shown in FIG. 3. The position/thrust obtaining unit 6d obtains the position of the stage 4 on the movement track and the thrust actually applied to the moving stage 4 based on stage control information fed from the stage controller 5. Based on the position and thrust thus obtained, the vibration control FF control unit 6e performs feed-forward control of the servo valve 24 to allow the servo valve 24 to generate a control force commensurate with vibrations of the vibration isolation table 1 caused by the movement of the stage 4.

The vibration control FF control unit 6e receives a timing signal transmitted from the stage controller 5 to control the stage 4, and feeds a control signal to the servo valve 24 at substantially the same timing as control of the movement of the stage 4 (i.e., in real time). The control signal corresponds to the vibration control feed-forward manipulated variable determined based on the obtained values of the position and acceleration as described above.

—Method for Obtaining Position and Thrust of Stage—

An exemplary method for obtaining the position and thrust of the stage 4 will be described below.

In the exemplary configuration according to the first embodiment, the position/thrust obtaining unit 6d obtains the position of the stage 4 and the thrust applied to the stage 4 in real time, based on the control signal output from the stage controller 5.

Specifically, as described above, the stage position sensor S4 and the stage thrust sensor S5 are both connected to the controller 6, and feed respective detection signals (the actually measured value of position and the actually measured value of thrust) as control signals for the stage 4 to the controller 6. When the movement of the stage 4 is controlled, the position/thrust obtaining unit 6d obtains these control signals in real time, and transmits the obtained signals to the vibration control FF control unit 6e. The vibration control FF control unit 6e receives the transmitted signals, and calculates the vibration control feed-forward manipulated variable.

—Method for Computing Vibration Control Feed-Forward Manipulated Variable—

A method for computing a vibration control feed-forward manipulated variable will be specifically described below.

For convenience of description, suppose that a predetermined thrust f is imparted to the stage 4, which linearly moves along the x axis as indicated by arrows shown in FIG. 1. In this case, initially, the distance $\Delta x$ over which the stage 4 moves from a reference position is substantially equal to the command value of position described above. The stage 4 moving as described above causes the center of mass of the entire vibration isolation table 1 that is the target for vibration isolation to shift along the x axis. This causes the distribution of static loads among the air spring units 2, 2, . . . to change. This is equivalent to a situation where a torque N1, which is described as $N1=m \cdot g \cdot \Delta x$, is generated in the clockwise direction ($\theta$) shown in FIG. 1 around the y axis passing through the center of mass of the target for vibration isolation, where m represents the mass of the stage 4 (exactly, the sum of the mass of the stage 4 and the mass of the mounted object S), and g represents the acceleration of gravity.

Thus, if the internal pressures of the air springs are controlled to match the changed distribution of the loads among the air spring units 2, 2, . . . resulting from the movement of the stage 4, and as a result, a torque having the same magnitude as that of the torque N1 described above is generated in a direction ($-\theta$) opposite to that of the torque N1, the inclination (displacement) of the vibration isolation table 1 that is the target for vibration isolation is reduced. This can reduce shaking of the vibration isolation table 1 resulting from the inclination. In the shown example, the internal pressure of the right air spring is increased, while the internal pressure of the left air spring is reduced. The controlled variables of the internal pressures of the individual air springs are actually geometrically determined in accordance with the arrangement of the air springs (their positions relative to the center of mass of the target for vibration isolation).

If the predetermined thrust f is imparted to the stage 4 as described above, the reactive force F (=−f) generated by the movement of the stage 4 acts on the vibration isolation table 1 via the apparatus body 3. A line of action of this reactive force F is substantially horizontal, and does not pass through the center of mass of the target for vibration isolation. Thus, a torque N2, which is described as $N2=-f \cdot h$, is generated around the y axis, where h represents the vertical distance between the line of action and the center of mass. The vertical distance h may be actually measured in advance. In view of the stage 4 moving horizontally, the vertical distance h is kept substantially fixed.

To compensate for the torque N2 generated by the reactive force F, the internal vertical pressures of the air springs need to be controlled to generate a torque having the same magnitude as that of the torque N2 in a direction opposite to that of the torque N2, just like the torque N1 described above. In this case, the direction of the torque N2 ($-\theta$) is opposite to that of the torque N1. Thus, in view of the fact that the relationship between the control input U to the air spring units 2 (the servo valve 24) and a force Fa generated by the air spring units 2 is represented by the following expression (1), the manipulated variable $U_\theta$ is represented by the following expression (2).

[Expression 1]

$$Fa = \frac{Kv \cdot Am}{Tv \cdot s + 1} \cdot U \quad (1)$$

[Expression 2]

$$U_\theta = \frac{Tv \cdot s + 1}{Kv \cdot Am} \cdot (m \cdot g \cdot \Delta x - f \cdot h) \quad (2)$$

In these expressions (1) and (2), Kv, Tv, and Am represent the gain of the servo valve 24, a time constant, and the pressure-receiving area of each air spring, respectively.

If air springs supporting a horizontal load are also arranged, a force having the same magnitude as that of a reactive force F applied to the stage 4 accordingly is preferably generated in a direction (−x direction) opposite to that of the reactive force F. The manipulated variable $U_x$ of the air springs supporting a horizontal load is represented by the following expression (3).

[Expression 3]

$$U_x = \frac{Tv \cdot s + 1}{Kv \cdot Am} \cdot f \quad (3)$$

Note that the manipulated variables $U_\theta$ and $U_x$ are converted into manipulated variables of the individual air springs using a predetermined conversion equation determined in accordance with the arrangement of the individual air springs as described above. The vibration control FF control unit 6e uses the actually measured value of position output from the stage position sensor S4 as the distance Δx, and uses the actually measured value of thrust output from the stage thrust sensor S5 as the thrust f, thereby computing the manipulated variables $U_\theta$ and $U_x$ at substantially the same time as control of the movement of the stage 4.

—Operation of Active Vibration Isolator—

In this exemplary configuration, while the movement of the stage 4 is controlled in real time, the internal pressures of the air springs are also controlled based on the vibration control feed-forward manipulated variable determined as described above in real time.

Specifically, when the movement of the stage 4 is controlled in the apparatus D, signals indicating the actually measured value of position and the actually measured value of thrust are first output from the stage position sensor S4 and the stage thrust sensor S5, respectively, and are received by the controller 6. Upon receiving these signals, the position/thrust obtaining unit 6d of the controller 6 obtains the position and thrust of the stage 4 in real time, and transmits the obtained position and thrust to the vibration control FF control unit 6e. Upon receiving the obtained position and thrust, the vibration control FF control unit 6e determines the manipulated variables $U_\theta$ and $U_x$ for controlling the internal pressures of the air springs as described above.

Then, the vibration control FF control unit 6e outputs the manipulated variables $U_\theta$ and $U_x$ to the servo valve 24 as soon as the manipulated variables $U_\theta$ and $U_x$ are determined. As described above, the actually measured value of thrust reflects the influence of the friction applied to the stage 4. Thus, when the movement of the stage 4 is about to cause the vibration isolation table 1 to shake through the apparatus D, a control force reflecting the influence of the friction applied to the stage 4 and other elements is imparted to the vibration isolation table 1, thereby sufficiently reducing the shaking. The slight shaking nevertheless generated is reduced by the vibration isolation FB control unit 6a and the vibration control FB control unit 6b performing feedback control of the acceleration and displacement.

FIG. 4 is an image graph showing the above-described effect of reducing shaking. More specifically, an upper portion of FIG. 4 shows a command value of acceleration of the stage 4, and a lower portion of FIG. 4 shows the difference (position deviation) between a target value and an actually measured value of the position of the stage 4. The difference is caused by the movement of the stage 4. FIG. 5 is an explanatory graph showing, in an enlarged manner, an enclosed region R shown in the lower portion of FIG. 4.

More specifically, the command value of acceleration in the upper portion of FIG. 4 represents the acceleration determined based on the command value of position of the stage 4 and the (preset) period of time during which the stage 4 moves. That is to say, the command value of acceleration is equal to the ideal acceleration of the stage 4, which does not reflect the influence of friction and other elements.

On the other hand, the graph indicated by the thinner broken line shown in the lower portion of FIG. 4 shows shaking generated when the command values of position and acceleration described above are used as estimated values of position and acceleration, respectively, in the active vibration isolator described in Japanese Patent No. 4970904 described above.

As shown in FIGS. 4 and 5, if the active vibration isolator according to the first embodiment is employed (see the thicker broken line shown in each of FIGS. 4 and 5), it has higher vibration control performance than the active vibration isolator according to Japanese Patent No. 4970904 described above.

As described above, according to the configuration described above, the actual thrust f applied to the stage 4 is referred to control the servo valve 24. The actual thrust f reflects, for example, friction applied to the stage 4 by the movement of the stage 4. Thus, more precise control is achieved, and in turn, high vibration control performance can be achieved as shown in the lower portion of FIG. 4.

In addition, control is performed based on a combination of the thrust f actually applied to the stage 4 and the position Δx of the stage 4 to reduce vibrations caused by the torque N2 associated with the reactive force F applied to the vibration isolation table 1. This also helps achieve high vibration control performance.

Thus, according to the configuration described above, control is performed based on a combination of the thrust f actually applied to the stage 4 and the position Δx of the stage 4, thereby achieving high vibration control performance.

As shown in FIGS. 1 to 3, to control the stage 4, a control system independent of the vibration isolation table 1 may be used. According to the configuration described above, one of the control signals for use to move the stage 4 is diverted. This control signal corresponds to the thrust applied to the stage 4. This allows the position/thrust obtaining unit 6d to rapidly and reliably obtain the thrust applied to the stage 4 without obtaining the thrust from scratch.

Second Embodiment

In the first embodiment, the position/thrust obtaining unit 6d obtains the thrust applied to the stage 4, based on the control signal for use to control the movement of the stage 4. However, such a configuration is merely an example of the present disclosure. A second embodiment of the present disclosure will now be described. Note that commonalities with the first embodiment will not be described.

FIG. 6 is an explanatory graph exemplifying the relationship between an actual thrust applied to a stage 4 and a value obtained by previously estimating, and tuning, the thrust.

In an exemplary configuration according to the second embodiment, a position/thrust obtaining unit 6d computes the thrust applied to the stage 4 in advance based on information on control of the stage 4, thereby obtaining the thrust.

Specifically, just like the first embodiment, a controller 6 is connected to a stage position sensor S4, and receives a signal indicating the position of the stage 4 and a signal indicating the period of time during which the stage 4 moves as information on control of the stage 4.

Here, suppose that the application of a thrust $F_0$ to the stage 4 for a predetermined time period Δt triggers the stage 4 to move at a predetermined speed $v_0$. In this case, the following expressions (4) and (5) hold. The expression (4) represents a balance between the thrust $F_0$ applied to the stage 4 and kinetic friction. The expression (5) represents the relationship between an impulse applied to the stage 4 and the amount of change in momentum.

Expression 4

$$F_0 = \mu mg \tag{4}$$

Expression 5

$$F_0 \Delta t = m v_0 \tag{5}$$

Here, μ represents the coefficient of kinetic friction of the stage 4, and m represents the mass of the stage 4 as described above.

The expressions (4) and (5) are arranged to obtain a relational expression (6) associating the predetermined speed $v_0$, the predetermined time period $\Delta t$, the coefficient μ of kinetic friction, and the mass m of the stage 4 with one another.

Expression 6

$$\mu g = v_0/\Delta t \qquad (6)$$

Meanwhile, the controller 6 computes an acceleration $a_1$ without friction based on the signal indicating the position of the stage 4 and the signal indicating the period of time during which the stage 4 moves. This acceleration $a_1$ is equal to the command value of acceleration described above.

An estimated value f' of the thrust actually applied to the stage 4 is obtained as described below in consideration of the relational expression (6).

Expression 7

$$f' = m(a_1 - \mu g) = m(a_1 - v_0/\Delta t) \qquad (7)$$

As indicated by the expression (7), the estimated value f' of the thrust is obtained in the following manner. Specifically, a value obtained by dividing the predetermined speed $v_0$ by the predetermined time period $\Delta t$ is subtracted from the command value of acceleration $a_1$, and the resultant value is multiplied by the mass m of the stage 4. In this exemplary configuration according to the second embodiment, the command value of acceleration $a_1$ and any other parameter are combined together to compute the estimated value f' of the thrust. Here, the controller 6 receiving the coefficient μ of kinetic friction in advance may allow the estimated value f' to be computed in combination with the command value of acceleration $a_1$ and the acceleration of gravity g, or may allow the predetermined speed $v_0$ or the predetermined time period $\Delta t$ to be computed based on inputs from sensors and other factors, thus determining the estimated value f' using the computation result. Alternatively, the estimated value f' may be determined based on information on control of the movement of the stage 4.

The estimated value f' of the thrust may be tuned through control of a speed gain as shown in FIG. 6. To tune the value, an operator may manually adjust the speed gain and other factors, or the controller 6 may automatically adjust them. As well known, the actual thrust applied to the stage 4 may be slightly offset from zero even while the stage 4 is at rest. To address this problem, tuning allows the estimated value f' to be adjusted to be zero while the stage 4 is at rest. This can enhance the vibration control performance of the vibration isolator A. In addition, the peak of the estimated value f' may be controlled by tuning as shown in FIG. 6. The peak is matched with the actually measured value, thereby increasing the accuracy of the estimated value f'. This can further enhance the vibration control performance of the vibration isolator A.

Here, the correlation between the actual speed v of the stage 4 reflecting the influence of friction and the predetermined speed $v_0$ described above is presumed to be positive. Thus, suppose that the actual speed v of the stage 4 is proportional to the predetermined speed $v_0$. In this case, the estimated value f' of the thrust is obtained by the following relational expression (8).

Expression 8

$$f' = m(a_1 - b \cdot v/\Delta t) \qquad \text{Expression 8}$$

where b represents the factor of proportionality.

Just like operation using the expression (7), the value of the second term of the expression (8) can be determined based on inputs from sensors and other factors. To determine this value, the control signal and parameters that are used by the stage controller 5 for control of the movement of the stage 4 may be diverted.

Thus, the estimated value f' of the thrust is determined. The position/thrust obtaining unit 6d thus estimates the thrust in advance when the movement of the stage 4 is controlled. As in the first embodiment, the vibration control FF control unit 6e uses the command value of position output from the stage position sensor S4 as the distance $\Delta x$, and uses the estimated value f' computed in advance as described above as the thrust f, thereby computing, and obtaining, the manipulated variables $U_\theta$ and $U_x$.

In this exemplary configuration according to the second embodiment, the internal pressures of the air springs are controlled based on the vibration control feed-forward manipulated variables determined as described above. This control is performed earlier than control of the movement of the stage 4.

Specifically, when the movement of the stage 4 is controlled in the apparatus D, a signal including information on this control is first output from the stage controller 5, and is received by the controller 6. Upon receiving the signal, the position/thrust obtaining unit 6d of the controller 6 obtains the position and thrust of the stage 4 in advance, and transmits the obtained position and thrust to the vibration control FF control unit 6e. Upon receiving the obtained position and thrust, the vibration control FF control unit 6e determines the manipulated variables $U_\theta$ and $U_x$ for controlling the internal pressures of the air springs as described above.

Then, if a timing signal is output from the stage controller 5 prior to control of the movement of the stage 4, the vibration control FF control unit 6e of the controller 6 that has received this timing signal outputs the manipulated variables $U_\theta$ and $U_x$ determined in advance as described above to the servo valve 24 at an earlier timing by a time delay in control of the air springs than the control of the stage 4. Here, the timing signal is output earlier than the timing when the movement of the stage 4 is controlled. Thus, if the control signal is output to the servo valve 24 after a predetermined time period has elapsed since the reception of this timing signal, the internal pressures of the air springs can be controlled earlier than the stage 4 only by a time delay of one of control systems near the vibration isolation table 1.

Just like the actually measured value of thrust, the value f' of thrust estimated in advance reflects the influence of friction applied to the stage 4. Thus, when the movement of the stage 4 is about to cause the vibration isolation table 1 to shake through the apparatus D, a control force reflecting the influence of the friction applied to the stage 4 and other elements is imparted to the vibration isolation table 1, thereby sufficiently reducing the shaking.

As can be seen from FIGS. 4 and 5, if the active vibration isolator according to the second embodiment is employed (see the solid line shown in each of FIGS. 4 and 5), it has higher vibration control performance than the active vibration isolator according to Japanese Patent No. 4970904 described above and the active vibration isolator according to the first embodiment. Note that the displacement shown in each of FIGS. 4 and 5 corresponds to a value obtained when an offset amount and the peak during the period of time during which the stage 4 is at rest are tuned to the term in which the predetermined speed $v_0$ is divided by the predetermined time period $\Delta t$ as described above.

As described above, according to the second embodiment, the thrust applied to the stage 4 is calculated in advance, and the servo valve 24 is controlled based on the calculation result thus obtained. Such control allows the servo valve 24 and the air springs to be actuated before control of the movement of the stage 4 in a situation where a response lag is concerned, such as in a situation where the servo valve 24 operates the air springs. This allows a control force to be imparted to the vibration isolation table 1 early enough before moving the stage 4 generates shaking.

That is to say, the thrust and other factors are estimated based on information on control of the stage 4 before the stage 4 actually moves, thereby performing appropriate control. Even if a member having a long response lag, such as an air spring, is used, a control force is imparted, without delay, to the vibration isolation table 1 that is about to shake, thereby sufficiently reducing shaking.

Other Embodiments

In the first and second embodiments, the servo valve 24 is exemplified as an actuator for the vibration isolation table 1. However, this is merely an example of the present disclosure. For example, a linear motor may be used instead of the servo valve 24.

In the first and second embodiments, the position/thrust obtaining unit 6d and the vibration control FF control unit 6e form part of the controller 6. However, this is merely an example of the present disclosure. At least one of the position/thrust obtaining unit 6d and the vibration control FF control unit 6e may form part of the stage controller 5.

Specifically, in the second embodiment, the controller 6 estimates the thrust based on stage control information output from the stage controller 5 (position, thrust) and the timing signal, and computes the manipulated variables $U_\theta$ and $U_x$ based on the estimation result. Alternatively, for example, the stage controller 5 may estimate the thrust, and may output the estimation result to the vibration control FF control unit 6e in advance. That is to say, the position/thrust obtaining unit 6d may form part of the stage controller 5. Still alternatively, the stage controller 5 may estimate the thrust, and may compute the manipulated variables $U_\theta$ and $U_x$ based on the estimation result. The estimation result may be output to the servo valve 24 in advance. That is to say, the position/thrust obtaining unit 6d and the vibration control FF control unit 6e may both form part of the stage controller 5.

What is claimed is:

1. An active vibration isolator comprising:
   a stage moving under thrust to position a mounted object;
   a vibration isolation table supporting the stage;
   an actuator imparting, to the vibration isolation table, a control force that reduces vibrations of the vibration isolation table;
   a stage condition obtaining unit obtaining a position of the stage on a movement track and an estimation of the thrust to be applied to the stage with movement of the stage, wherein the stage condition obtaining unit obtains the estimation of the thrust in advance based on a kinetic friction force applied to the stage; and
   a controller controlling the actuator, based on what is obtained by the stage condition obtaining unit, to allow the actuator to generate a control force commensurate with vibrations of the vibration isolation table caused by the movement of the stage.

2. The active vibration isolator of claim 1, wherein the controller controls the actuator, based on what is obtained by the stage condition obtaining unit, to allow the actuator to generate a control force commensurate with vibrations caused by a torque applied to the vibration isolation table through the movement of the stage.

* * * * *